(12) United States Patent
Kim et al.

(10) Patent No.: US 12,387,316 B2
(45) Date of Patent: Aug. 12, 2025

(54) SEMICONDUCTOR MANUFACTURING FACILITY AND TEACHING METHOD OF SEMICONDUCTOR MANUFACTURING FACILITY

(71) Applicant: SEMES CO., LTD., Cheonan-si (KR)

(72) Inventors: Seung Won Kim, Yongin-si (KR); Ji Soo Park, Hwaseong-si (KR); Jun Cheol Park, Suwon-si (KR); Yong Hun Sim, Yongin-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 419 days.

(21) Appl. No.: 18/146,613

(22) Filed: Dec. 27, 2022

(65) Prior Publication Data

US 2023/0206426 A1   Jun. 29, 2023

(30) Foreign Application Priority Data

Dec. 27, 2021   (KR) .......................... 10-2021-0189018
Sep. 20, 2022   (KR) .......................... 10-2022-0118539

(51) Int. Cl.
*G06T 7/00*        (2017.01)
*H01L 21/67*       (2006.01)
*H01L 21/68*       (2006.01)

(52) U.S. Cl.
CPC ........ *G06T 7/001* (2013.01); *H01L 21/67253* (2013.01); *H01L 21/67259* (2013.01);
(Continued)

(58) Field of Classification Search
CPC .......... G06T 7/001; G06T 2207/20081; G06T 2207/30148; G06T 7/73; H01L 21/67253;
(Continued)

(56) References Cited

U.S. PATENT DOCUMENTS 10,827,137 B2 *  11/2020  Zhang ................... C23C 14/042
2007/0189596 A1 *  8/2007  Lee ........................... G06T 7/33
                                                                 382/151
2019/0172742 A1 *  6/2019  Mochizuki ............ H01L 21/681

FOREIGN PATENT DOCUMENTS

JP         2000068359 A   *  3/2000
JP         2021-028098 A      2/2021
(Continued)

*Primary Examiner* — Samir A Ahmed
(74) *Attorney, Agent, or Firm* — Harness, Dickey & Pierce, P.L.C.

(57) ABSTRACT

Disclosed are a semiconductor manufacturing facility and a teaching method of the semiconductor manufacturing facility, which prevent partial whitening of image information for obtaining a teaching reference point of a teaching target during a teaching operation of a transfer device that transfers a wafer or a mask, thereby improving readability. The semiconductor manufacturing facility includes: a teaching target in which a first teaching reference point and a second teaching reference point are formed; a transfer device on which the teaching target is mounted; and a teaching inspection unit for image-analyzing the first teaching reference point and the second teaching reference point of the teaching target, calculating center coordinates of each of the first teaching reference point and the second teaching reference point, and teaching the transfer device with an angle value of a line connecting the respective center coordinates.

12 Claims, 9 Drawing Sheets

(52) U.S. Cl.
CPC .. *H01L 21/681* (2013.01); *G06T 2207/20081* (2013.01); *G06T 2207/30148* (2013.01)

(58) Field of Classification Search
CPC ............. H01L 21/67259; H01L 21/681; H01L 21/677; H01L 21/67703; H01L 21/68
See application file for complete search history.

(56) References Cited

FOREIGN PATENT DOCUMENTS

| KR | 100772843 | B1 | * | 11/2007 | ............... G06T 7/33 |
|----|-----------|----|---|---------|---------------------------|
| KR | 20110056841 | A | * | 5/2011 | ....... H01L 21/67742 |
| KR | 101957096 | B1 | | 3/2019 | |
| KR | 102239052 | B1 | | 4/2021 | |

* cited by examiner

SEMICONDUCTOR MANUFACTURING FACILITY AND TEACHING METHOD OF SEMICONDUCTOR MANUFACTURING FACILITY

CROSS-REFERENCE TO RELATED APPLICATIONS

This application claims priority to and the benefit of Korean Patent Application Nos. 10-2021-0189018 and 10-2022-0118539 filed in the Korean Intellectual Property Office on Dec. 27, 2021 and Sep. 20, 2022, the entire contents of which are incorporated herein by reference.

TECHNICAL FIELD

The present invention relates to a semiconductor manufacturing facility and a teaching method of the semiconductor manufacturing facility, and more particularly, to a semiconductor manufacturing facility and a teaching method of the semiconductor manufacturing facility for teaching a transfer reference point when a transfer device transfers a transferred object.

BACKGROUND ART

In the performance of each process, such as an exposure process, an etching process, and a deposition process, for semiconductor and display devices, it is necessary to transfer a wafer or mask to a process chamber or inspection device between the respective processes, and these wafers or masks are mainly placed by precisely adjusting a final seating position of the wafer or mask by a transfer device, such as a multi-degree-of-freedom robot.

In the transfer device, in the case of installation on the first production line, replacement of arms or hands, or impact occurrence, it is necessary to readjust a starting point of a transfer operation of the arms and a reference point of a final transfer position, and in the reference point adjustment operation, a driving point between transfer operations and the reference point of the final transfer position are adjusted by using a teaching device.

Usually, the teaching device mounts a teaching target corresponding to a shape of a mask or wafer on a hand of a transfer device, receives a teaching reference point in the form of a hole or groove formed in a teaching target as image information using a vision system, determines how far the center point of the teaching reference point recorded in the received image information is away from the reference point where the mask or wafer is be actually located in the X, Y, and Z axes in three dimensions, and corrects a final transfer position of the transfer device as much as the deviated position.

During the teaching operation, a teaching device in the related art arranges lights for emitting light around a teaching target, so that the teaching target is photographed in the state a shadow is not formed around the teaching reference point of the teaching target.

In this case, in the teaching device in the related art, a black plate is installed around the light on which a camera is mounted to reduce the reflectance of light, but the black plate does not uniformly absorb light, and a partial whitening phenomenon occurs in which the brightness of only a specific area in the vicinity of the teaching reference point is changed.

Accordingly, since the image information in which partial whitening has occurred is obtained in the image information obtained by photographing the teaching reference point of the teaching target, when the coordinate values for the center point of the teaching reference point are analyzed as an image, the center point is not accurately read.

On the other hand, the teaching device in the related art generally forms the teaching reference point of the teaching target in the form of one hole or groove, obtains image information for the teaching reference point of the one hole or groove, and performs the teaching work of the axis-to-axis distance for the X, Y, and Z axes in three dimensions.

However, the teaching method in the related art of correcting the reference point by analyzing the center point of one hole or groove formed in the teaching target as an image may correct only the vertical and horizontal distances in the X axis, Y axis, and Z axis in three dimensions, but there is a problem in that it is impossible to recognize how much the teaching target has rotated.

SUMMARY OF THE INVENTION

The present invention has been made in an effort to provide a semiconductor manufacturing facility and a teaching method of the semiconductor manufacturing facility, which prevent partial whitening of image information for obtaining a teaching reference point of a teaching target during a teaching operation of a transfer device that transfers a wafer or a mask, thereby improving readability.

The present invention has also been made in an effort to provide a semiconductor manufacturing facility and a teaching method of the semiconductor manufacturing facility, which perform a teaching operation by correcting not only a distance of a teaching target to a teaching reference point, but also an angle of the teaching target during the teaching operation of a transfer device that transfers a wafer or a mask.

An exemplary embodiment of the present invention provides a semiconductor manufacturing facility, including: a teaching target in which a first teaching reference point and a second teaching reference point are formed; a transfer device on which the teaching target is mounted; and a teaching inspection unit for image-analyzing the first teaching reference point and the second teaching reference point of the teaching target, calculating center coordinates of each of the first teaching reference point and the second teaching reference point, and teaching the transfer device with an angle value of a line connecting the respective center coordinates.

According to the exemplary embodiment, the teaching inspection unit may include: a first lighting unit for emitting light around the first teaching reference point; a second lighting unit for emitting light around the second teaching reference point; a first camera for photographing the first teaching reference point and obtaining analog image information; a second camera for photographing the second teaching reference point and obtaining analog image information; a camera substrate module for digitally converting image information of each of the first camera and the second camera into first reference point image information and second reference point image information; and a teaching control unit for analyzing each of the first reference point image information and the second reference point image information to calculate first reference point center coordinates of the first teaching reference point and second reference point center coordinates of the second teaching reference point, calculating an angle value between a line connecting first reference point absolute coordinates and second reference point absolute coordinates and a line connecting the first reference point center coordinates and the second reference point center coordinates, and teaching the transfer device as much as the calculated angle value.

According to the exemplary embodiment, the teaching control unit overlaps the first reference point image information and the second reference point image information and integrates the overlapping image information into one integrated coordinate system, calculating a movement value for how much the first reference point center coordinates and the second reference point center coordinates have moved in an X-axis and an Y-axis from the first reference point absolute coordinates and the second reference point absolute coordinates in one integrated coordinate system, and teaching the transfer device as much as the calculated movement value.

According to the exemplary embodiment, the teaching inspection unit includes: a substrate frame part providing an mounting area in an inner space to mount the first lighting unit, the second lighting unit, the first camera, the second camera, and the camera substrate module; and a substrate cover part which is coupled to the substrate frame part so that the camera substrate module is not exposed, is formed with a first camera hole and a second camera hole through which a lens of the first camera and a lens of the second camera are exposed, respectively, and is formed with a first lighting hole and a second lighting hole through which the lighting unit and the second lighting unit are exposed, respectively.

According to the exemplary embodiment, the substrate cover part is formed of Carbon Fiber Reinforced Plastics (CFRP).

According to the exemplary embodiment, the substrate cover part is formed in the form of a plate in which carbon fibers are woven and a plurality of layers is laminated by bonding, and an exposed surface forms a fabric surface on which a plurality of fibers is woven.

According to the exemplary embodiment, the substrate cover part is formed in a white color.

According to the exemplary embodiment, the first lighting unit and the second lighting unit are formed of a surface lighting.

According to the exemplary embodiment, the first camera and the second camera are disposed between the first lighting unit and the second lighting unit.

According to the exemplary embodiment, the first camera and the second camera are disposed to face each other with respect to a center point of the substrate frame part in an area between the first lighting unit and the second lighting unit.

According to the exemplary embodiment, the teaching target is formed in a shape corresponding to a wafer or a mask.

Another exemplary embodiment of the present invention provides a teaching method of a semiconductor manufacturing facility, the teaching method including: a teaching inspection part arrangement operation of arranging a first camera and a second camera of an teaching inspection part under a transfer device on which a teaching target is mounted; a teaching reference point image information obtainment operation of photographing, by the first camera, a first teaching reference point of the teaching target to obtain analog image information, performing, by a camera substrate module, digital signal processing on the obtained analog image information, and converting the processed image information into first reference point image information, and photographing, by the second camera, a second teaching reference point of the teaching target to obtain analog image information, performing, by the camera substrate module, digital signal processing on the obtained analog image information, and converting the processed image information into second reference point image information; an image information coordinate conversion operation of analyzing, by the teaching control unit, a pixel value of the first reference point image information to convert first reference point center coordinates in the first reference point image information into coordinates, and analyzing a pixel value of the second reference point image information to convert second reference point center coordinates in the second reference point image information into coordinates; a coordinate system integration operation of outputting the first reference point central coordinates and the second reference point central coordinates to one coordinate system and integrating the first reference point central coordinates and the second reference point central coordinates; a teaching value analysis operation of calculating a movement value for how much the first reference point center coordinates and the second reference point center coordinates have moved from first reference point absolute coordinates and second reference point absolute coordinates and an angle value for how much the first reference point center coordinates and the second reference point center coordinates have rotated; and a teaching operation of teaching an end effector of the transfer device based on the movement value and the angle value.

According to the exemplary embodiment, in the teaching inspection unit arrangement operation, a first lighting unit emits light around a first teaching reference point of the teaching target, a second lighting unit emits light around a second teaching reference point of the teaching target, and a substrate cover part formed of Carbon Fiber Reinforced Plastics (CFRP) is disposed around the first lighting unit and the second lighting unit to implement a reflective function.

According to the exemplary embodiment, the substrate cover part is formed in the form of a plate in which carbon fibers are woven and a plurality of layers is laminated by bonding, and an exposed surface forms a fabric surface on which a plurality of fibers is woven.

According to the exemplary embodiment, the substrate cover part is formed in a white color.

According to the exemplary embodiment, the first lighting unit and the second lighting unit are formed of a surface lighting.

According to the exemplary embodiment, the first camera and the second camera are disposed between the first lighting unit and the second lighting unit.

According to the exemplary embodiment, the first camera and the second camera are disposed to face each other with respect to a center point of the substrate frame part in an area between the first lighting unit and the second lighting unit.

According to the exemplary embodiment, the teaching target is formed in a shape corresponding to a wafer or a mask.

Still another exemplary embodiment of the present invention provides a semiconductor manufacturing facility, including: a teaching target in which a first teaching reference point and a second teaching reference point are formed; a transfer device on which the teaching target is mounted; and a teaching inspection unit including a first lighting unit for emitting light around the first teaching reference point and formed of a surface light source, a second lighting unit for emitting light around the second teaching reference point and formed of a surface light source, a first camera for photographing the first teaching reference point to obtain analog image information and disposed between the first lighting unit and the second lighting unit, a second camera for photographing the second teaching reference point to obtain analog image information and disposed between the first lighting unit and the second lighting unit, a camera substrate module for digitally converting image information of each of the first camera and the second camera into first reference point image information and second reference point image information, a substrate frame part providing an mounting area in an inner space so that the first lighting unit, the second lighting unit, the first camera, the second camera, and the camera substrate module are mounted, a substrate cover part which is coupled to the substrate frame part so that the camera substrate module is not exposed, is formed with a first camera hole and a second camera hole through which a lens of the first camera and a lens of the second camera are exposed, respectively, is formed with a first lighting hole and a second lighting hole through which the first lighting unit and the second lighting unit are exposed, respectively, and is formed in the form of a plate in which carbon fibers are woven and a plurality of layers is laminated by bonding, has an exposed surface forming a fabric surface on which a plurality of fibers is woven, and is formed in a white color, and a teaching control unit for analyzing each of the first reference point image information and the second reference point image information, calculating first reference point center coordinates of the first teaching reference point and second reference point center coordinates of the second teaching reference point, and calculating an angle value between a line connecting the first reference point absolute coordinates and the second reference point absolute coordinates and a line connecting the first reference point center coordinates and the second reference point center coordinates, and teaching the transfer device as much as the calculated angle value.

The present invention has an effect of improving readability by preventing partial whitening of image information for obtaining a teaching reference point of a teaching target during a teaching operation of a transfer device that transfers a wafer or a mask.

In addition, the present invention has an effect of performing a teaching operation by correcting not only a distance of the teaching target to the teaching reference point but also the angle of the teaching target during a teaching operation of a transfer device that transfers a wafer or a mask.

DETAILED DESCRIPTION

Figure 1:
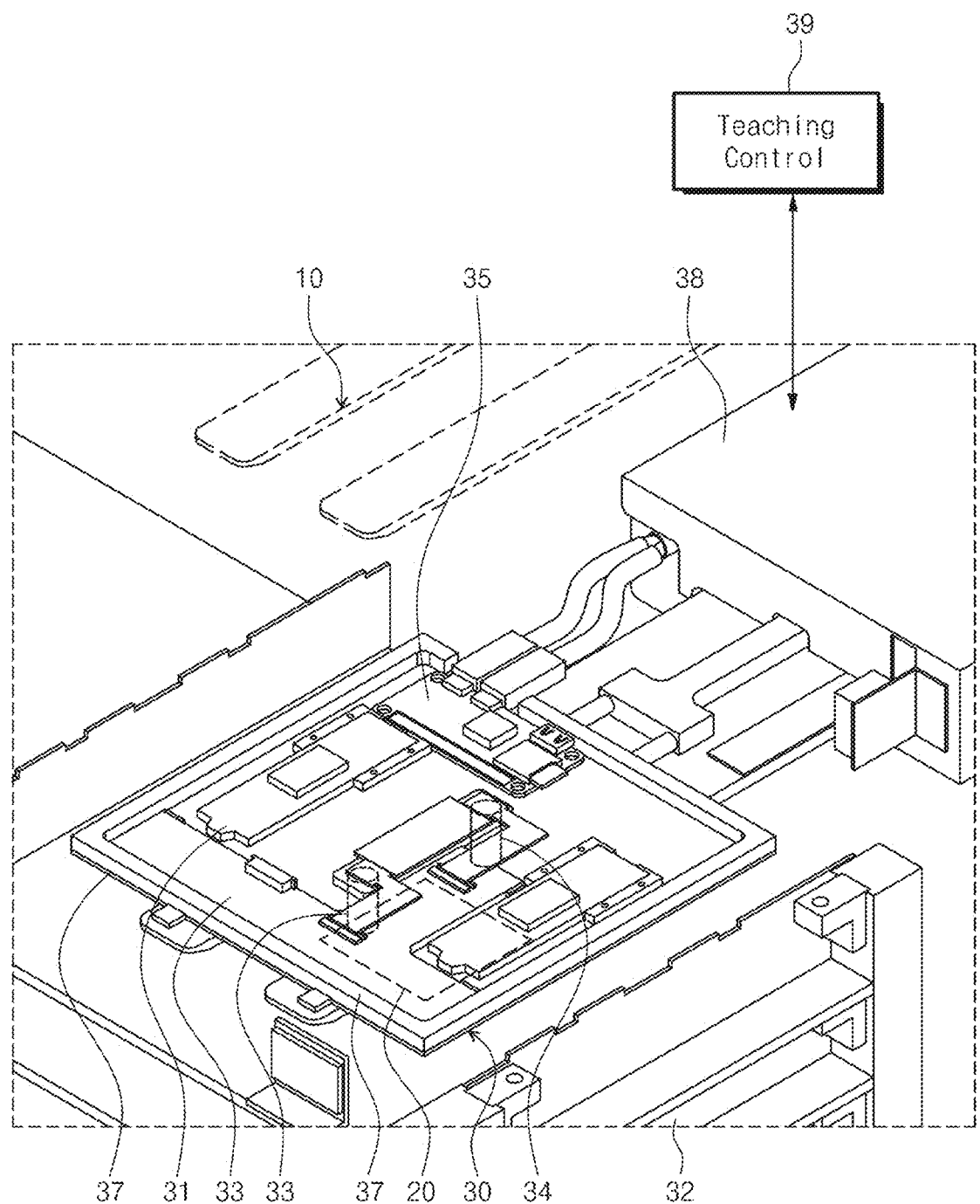
FIG. 1 is a perspective view of a state in which a transfer device of a semiconductor manufacturing facility teaches a teaching target according to an exemplary embodiment of the present invention.

Hereinafter, exemplary embodiments for carrying out the present invention will be described with reference to the accompanying drawings, and in this case, when it is said that a certain constituent element "includes" a certain constituent element throughout the specification, it is considered to mean that it may further include other constituent elements rather than controlling other constituent elements unless otherwise stated. In addition, terms such as " . . . unit" described in the specification is considered to mean a unit that processes at least one function or operation when describing electronic hardware or electronic software, and mean one component, a function, a use, a point, or a driving element when describing a mechanical device. In addition, hereinafter, the same or similar configurations will be described by using the same reference numerals, and overlapping descriptions of the same constituent elements will be omitted.

Figure 2:
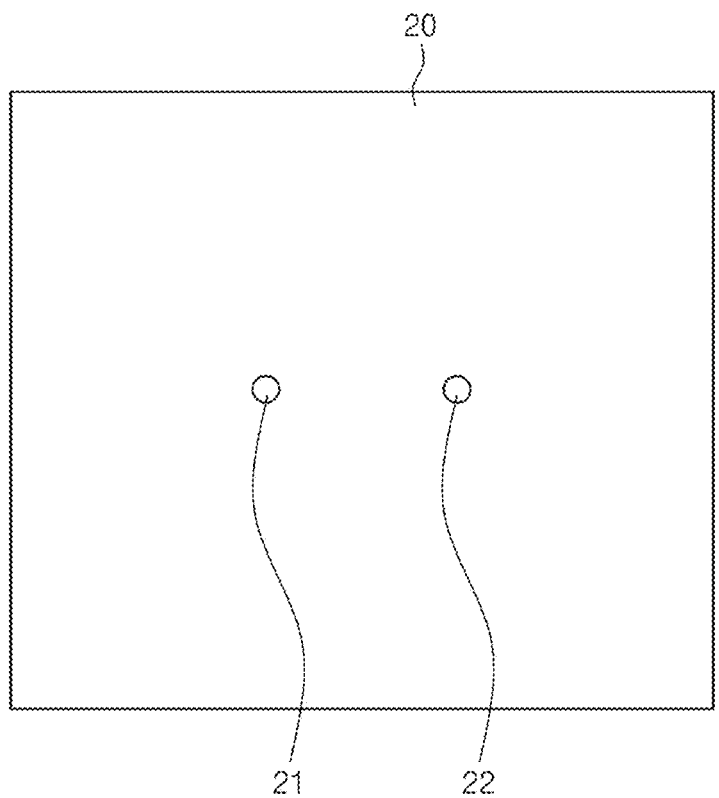
FIG. 2 is a configuration diagram of the teaching target illustrated in FIG. 1 viewed from above.
Figure 3:
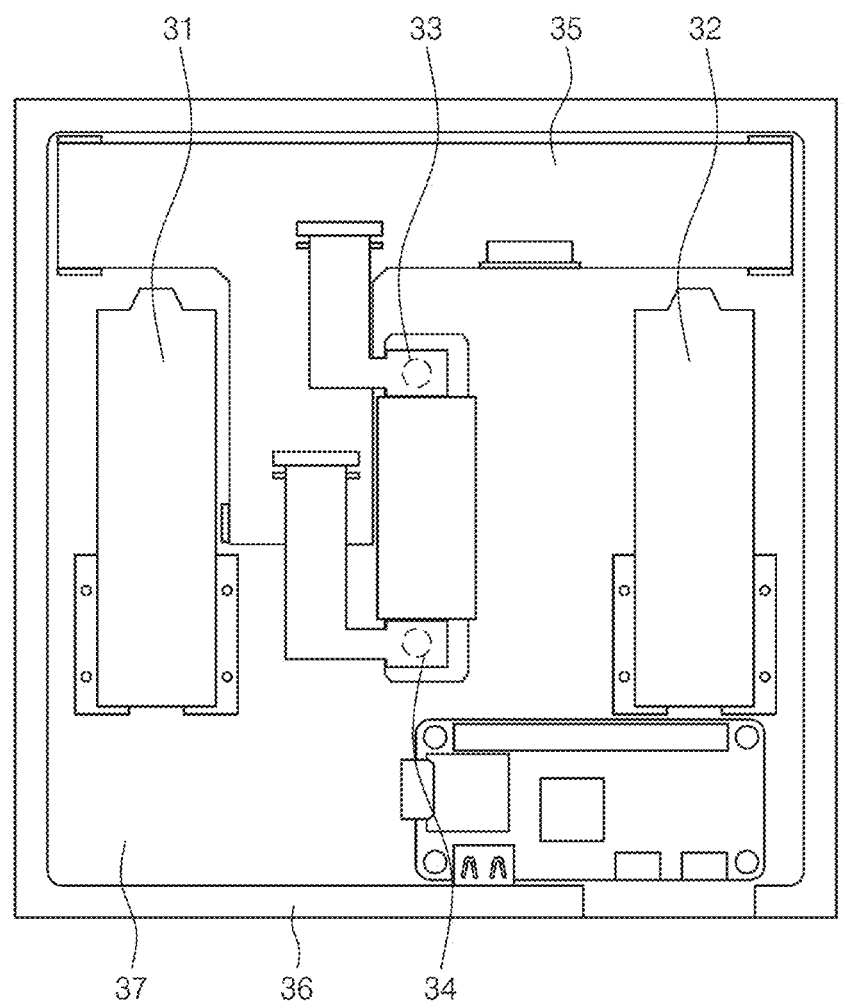
FIG. 3 is a top plan view of a state of a substrate frame part illustrated in FIG. 1 viewed from above.
Figure 4:
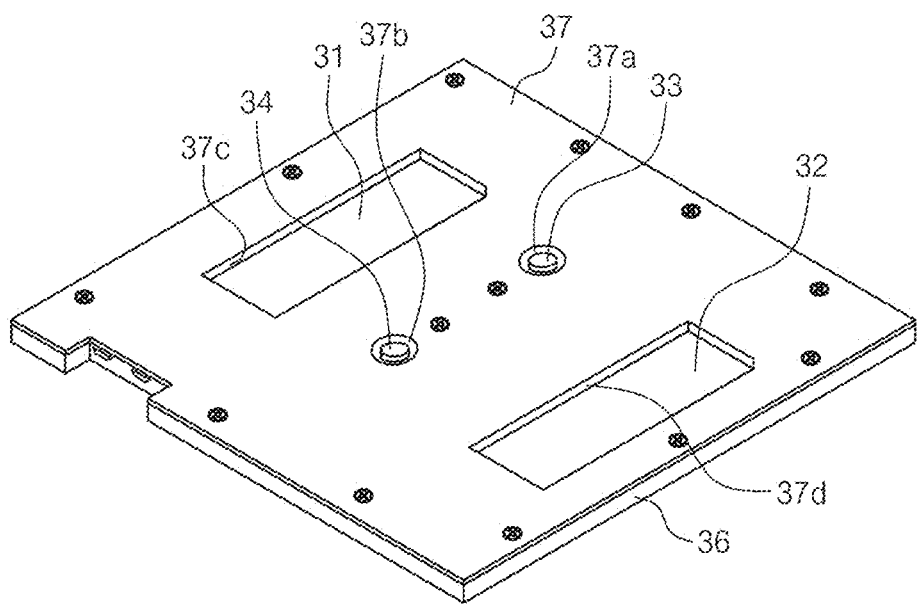
FIG. 4 is a perspective view of a state in which the substrate frame part illustrated in FIG. 1 is turned over.
Figure 5:
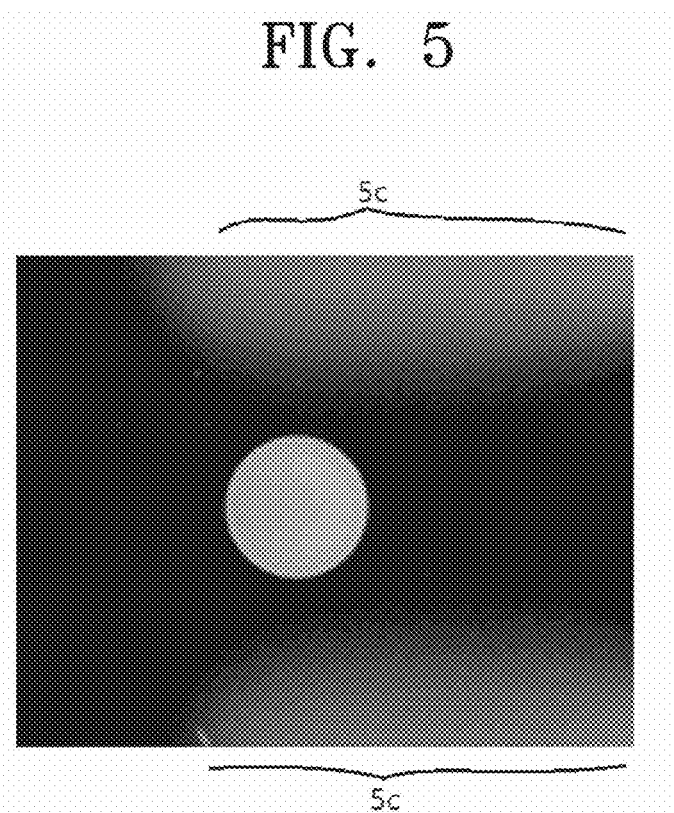
FIG. 5 is an image of a teaching target photographed by an existing camera in a state in which a substrate cover part is formed in black.
Figure 6:
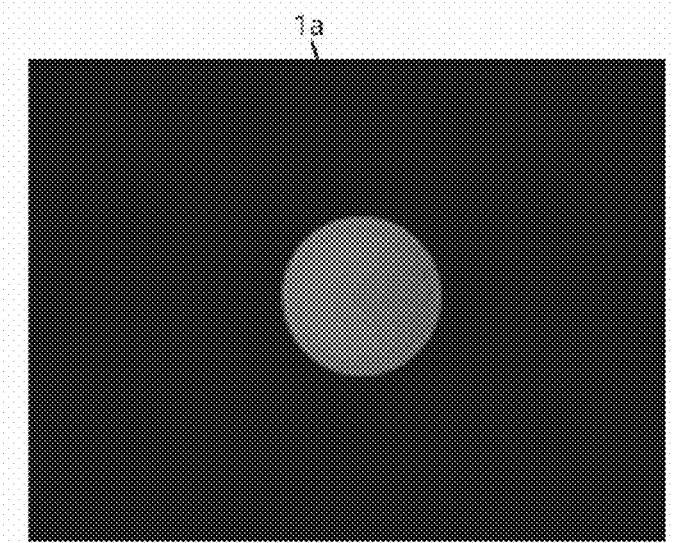
FIG. 6 is an image of the teaching target photographed by a first camera illustrated in FIG. 1.
Figure 7:
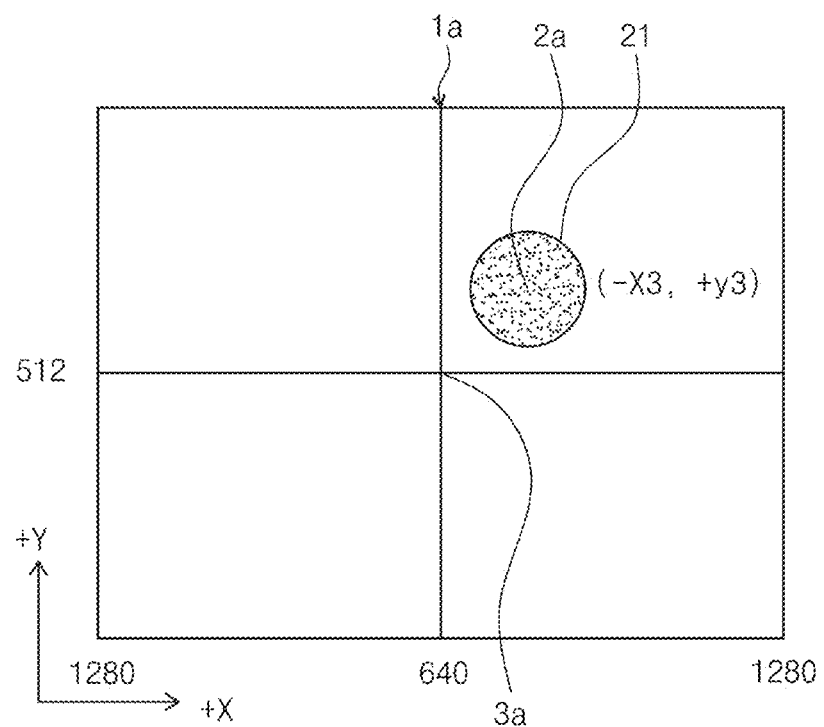
FIG. 7 is a graph in which a teaching control unit converts first reference point image information obtained from the first camera into coordinates.
Figure 8:
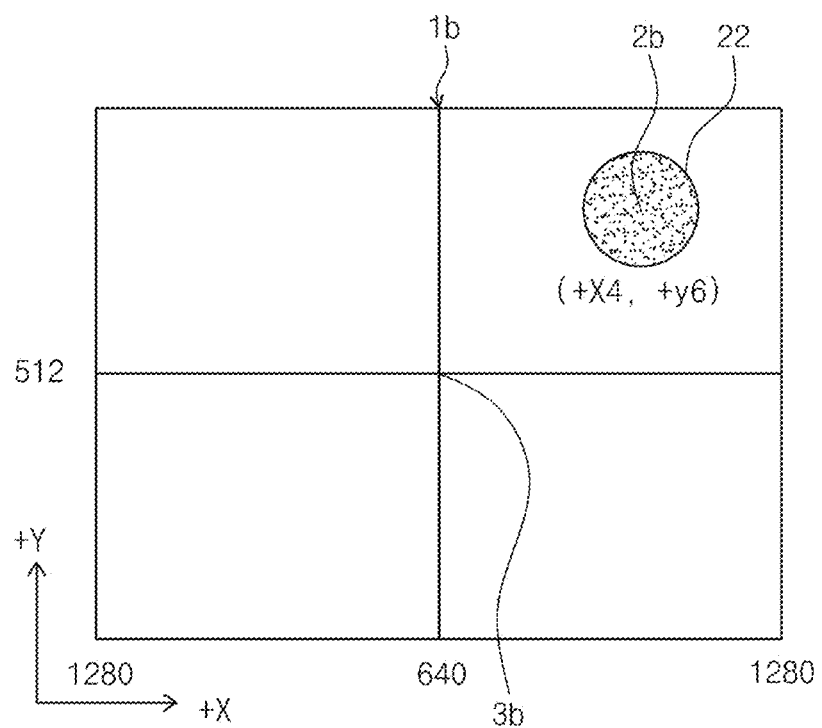
FIG. 8 is a graph in which the teaching control unit converts second reference point image information obtained from a second camera into coordinates.
Figure 9:
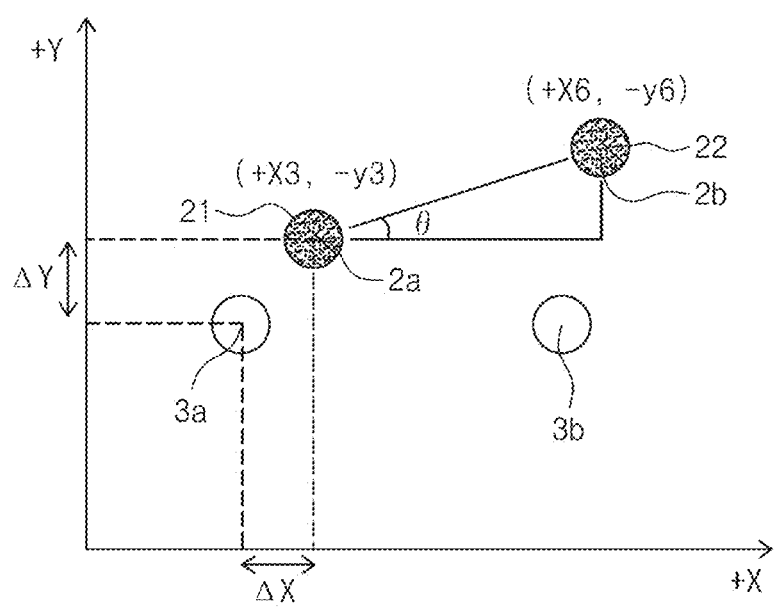
FIG. 9 is a graph of an integrated coordinate system in which the teaching control unit integrates the first reference point image information illustrated in FIG. 7 and the second reference point image information illustrated in FIG. 8.

FIG. 1 is a perspective view of a state in which a transfer device of a semiconductor manufacturing facility teaches a teaching target according to an exemplary embodiment of the present invention. FIG. 2 is a configuration diagram of the teaching target illustrated in FIG. 1 viewed from above. FIG. 3 is a top plan view of a state of a substrate frame part illustrated in FIG. 1 viewed from above. FIG. 4 is a perspective view of a state in which the substrate frame part illustrated in FIG. 1 is turned over. FIG. 5 is an image of a teaching target photographed by an existing camera in a state in which a substrate cover part is formed in black. FIG. 6 is an image of the teaching target photographed by a first camera illustrated in FIG. 1. FIG. 7 is a graph in which a teaching control unit converts first reference point image information obtained from the first camera into coordinates. FIG. 8 is a graph in which the teaching control unit converts second reference point image information obtained from a second camera into coordinates. FIG. 9 is a graph of an integrated coordinate system in which the teaching control unit integrates the first reference point image information illustrated in FIG. 7 and the second reference point image information illustrated in FIG. 8.

As illustrated in FIGS. 1 to 4, a semiconductor manufacturing facility according to an exemplary embodiment of the present invention includes a transfer device 10, a teaching target 20, and a teaching inspection unit 30.

The transfer device 10 is a robot that transfers wafers or masks during processes of a semiconductor manufacturing facility, and the position of a plurality of arms is controlled by a driving motor, and an end effector on which a wafer or a mask is seated is installed at a distal end and driven. In addition, the transfer device 10 includes not only a multi-axis robot composed of a plurality of arms as described above, but also a 2-axis robot or a 3-axis robot that transfers a wafer or a mask while moving to a position on a plane or in three-axes by an actuator, such as a linear motor, as a matter of course. Here, in the transfer device 10, the teaching target 20 is mounted on the end effector in order to teach a reference point. The present exemplary embodiment will be described based on the case where the transfer robot transfers a mask as an example.

The teaching target 20 is in the form of a jig mounted on the end of the end effector of the transfer device 10 to teach the reference point for a final transfer position of the transfer device 10, and is formed in a shape corresponding to a wafer or mask. In the present exemplary embodiment, the teaching target 20 is disposed under a substrate frame part 36 as illustrated in FIG. 1. In addition, in the present exemplary embodiment, the teaching target 20 is formed of a first teaching reference point 21 and a second teaching reference point 22 which are spaced apart from each other. Here, the first teaching reference point 21 and the second teaching reference point 22 are formed in the shape of a concave groove on one wide surface of the teaching target 20. However, in the present invention, the first teaching reference point 21 and the second teaching reference point 22 are not limited to groove shapes, and may be formed by being deformed into various configurations and shapes, such as a hole shape, a protrusion shape, or a printed pattern.

The teaching inspection unit 30 includes a first lighting unit 31, a second lighting unit 32, a first camera 33, a second camera 34, a camera substrate module 35, a substrate frame part 36, and a substrate cover part 37, a teaching driving unit 38, and a teaching control unit 39.

The first lighting unit 31 is mounted in the substrate frame part 36, and may be configured in the form in which a light source is covered by a plate-shaped surface lighting cover. In this case, the light source of the first lighting unit 31 may be formed of a plurality of LED substrates which is arranged while being spaced apart from each other, and the lighting cover covering the LED substrate may be configured as a ceiling lighting that uniformly distributes LED light through a light guide plate or a direct lighting that disperses the light source of the LED through a reflective film or a light diffusion cover. However, the configuration and irradiation method of the first lighting unit 31 in the present invention is not limited to the above example, and may be modified and implemented with various light sources, such as a backlight light source, and various types of light diffusion covers as a matter of course. The first lighting unit 31 illuminates the surroundings when the first teaching reference point 21 and the second teaching reference point 22 of the teaching target 20 are photographed by emitting light to a lower surface of the teaching target 20, thereby preventing partial whitening 5c from being formed around the first teaching reference point 21 and the second teaching reference point 22 when the first camera 33 and the second camera 34 obtain image information about the first teaching reference point 21 and the second teaching reference point 22. Since the first lighting unit 31 is configured in the form of a surface lighting and generates a surface light source in the entire periphery of the first camera 33 and the second camera 34, the entire luminance is maintained uniformly by the surface light source, thereby preventing the partial whitening 5c from being formed.

The second lighting unit 32 is mounted in the substrate frame part 36, and may be configured in the form in which a light source is covered by a plate-shaped surface lighting cover. The second lighting unit 32 is disposed while being spaced apart from the first lighting unit 31. In this case, the light source of the second lighting unit 32 may be formed of a plurality of LED substrates (not illustrated) arranged spaced apart from each other, and the lighting cover covering the LED substrate may be formed of a ceiling lighting that uniformly distributes the light of the LED through a light guide plate or a direct lighting that disperses the light source of the LED through a reflective film. However, the configuration and irradiation method of the second lighting unit 32 in the present invention is not limited to the above example, and may be modified and implemented with various light sources, such as a backlight light source, as a matter of course. The second lighting unit 32 emits the surroundings when the first teaching reference point 21 and the second teaching reference point 22 of the teaching target 20 are photographed by emitting light to the lower surface of the teaching target 20, thereby preventing partial whitening 5c from being formed around the first teaching reference point 21 and the second teaching reference point 22 when the first camera 33 and the second camera 34 obtain image information about the first teaching reference point 21 and the second teaching reference point 22. Since the second lighting unit 32 is configured in the form of a surface lighting and generates a surface light source in the entire periphery of the first camera 33 and the second camera 34, the entire luminance is maintained uniformly by the surface light source, thereby preventing the partial whitening 5c from being formed.

In this case, the first lighting unit 31 and the second lighting unit 32 are spaced apart from each other by a predetermined distance based on the center of the substrate frame part 36, and the first camera 33 and the second camera 34 are disposed between the first lighting unit 31 and the second lighting unit 32. Therefore, since the image information photographed by the first camera 33 and the second camera 34 are irradiated with the light source of the first lighting unit 31 and the light source of the second lighting unit 32 that generate a surface light source from both sides, the entire luminance of the light source is maintained uniformly, thereby preventing the partial whitening 5c from being generated.

In addition, when the first camera 33 and the second camera 34 are disposed between the first lighting unit 31, which is a surface light source, and the second lighting unit 32, which is a surface light source, a photographing area of the first camera 33 and a photographing area of the second camera 34 are disposed to be opposite to each other with respect to the center point of the substrate frame part 36 within the area between the first lighting unit 31 and the second lighting unit 32, so that the light source of the first lighting unit 31 and the light source of the second lighting unit 32 are uniformly emitted to the entirety of the first camera 33 and the second camera 34. When the first camera 33 and the second camera 34 are out of the area between the first lighting unit 31 and the second lighting unit 32, a light source of low brightness may be incident to the direction in which uniform light sources are not input to and are out of the first camera 33 and the second camera 34, and the partial whitening 5c may occur.

The first camera 33 is mounted in the substrate frame part 36 and obtains analog image information by photographing the first teaching reference point 21 of the teaching target 20. Here, the first camera 33 may be configured by using a CMOS camera. However, the configuration of the first camera 33 is not limited to a CMOS camera, and may be configured with various types of cameras.

The second camera 34 is mounted in the substrate frame part 36 and obtains analog image information by photographing the second teaching reference point 22 of the teaching target 20. Here, the second camera 34 may be configured by using a CMOS camera. However, the configuration of the second camera 34 is not limited to a CMOS camera, and may be configured with various types of cameras.

The camera board module 35 is mounted on the board frame part 36 and is electrically connected to the first camera 33 and the second camera 34. The camera substrate module 35 processes the analog image information photographed by the first camera 33 and the second camera 34 into a digital signal, converts the digital signal into image information, and transmits the converted image information to the teaching control unit 39. In describing the present exemplary embodiment, the digital image information converted by signal-processing, by the camera substrate module 35, the analog image information of the first camera 33, is defined as first reference point image information 1*a*, and the digital image information converted by signal-processing, by the camera substrate module 35, the analog image information of the second camera 34, is defined as second reference point image information 1*b*.

The substrate frame part 36 is formed in a wide rectangular frame shape, and provides a mounting area so that the first lighting unit 31, the second lighting unit 32, the first camera 33, the second camera 34 and the camera substrate module 35 are mounted in the inner space, and provides a coupling area so that the substrate cover part 37 may be seated and supported. The substrate frame part 36 is transformed into various shapes according to the shape of the first lighting unit 31, the second lighting unit 32, the first camera 33, the second camera 34, the camera substrate module 35, and the substrate cover part 37.

The substrate cover part 37 is coupled to cover an opening area of the substrate frame part 36. The substrate cover part 37 prevents direct contact between objects near a teaching jig and the camera substrate module 35 during the teaching operation and blocks electrical contact, thereby preventing contact accidents, such as short circuits. In addition, the substrate cover part 37 is formed with a first camera hole 37*a* and a second camera hole 37*b* through which the lens of the first camera 33 and the lens of the second camera 34 are exposed, respectively, and is formed with a first lighting hole 37*c* and a second lighting hole 37*d* through which the first lighting unit 31 and the second lighting unit 32 are exposed, respectively.

In addition, the substrate cover part 37 is formed of Carbon Fiber Reinforced Plastics (CFRP). The substrate cover part 37 is formed in the form of a plate in which carbon fibers are woven and a plurality of layers is laminated by bonding, and an exposed surface forms a fabric surface on which a plurality of fibers is woven. The fabric surface of the substrate cover part 37 scatters the light source reflected by the teaching target 20 again so that the entire teaching target 20 is uniformly irradiated with light, to prevent the partial whitening 5*c* from being generated within the first reference point image information 1*a* and the second reference point image information 1*b*. Therefore, the teaching control unit 39 may coordinate with the minimum deviation when reading the center points of the first teaching reference point 21 and the second teaching reference point 22 within the images of the first teaching reference point 21 and the second teaching reference point 22.

In particular, in the case of the present exemplary embodiment, the color of the substrate cover part 37 is theoretically formed with a color other than black, which is a color that absorbs all visible light. More preferably, the color of the substrate cover part 37 is theoretically formed to be white, which is a color that reflects all visible light, so that the entire luminance of the reflected light sources is uniformly reflected. Accordingly, when comparing the case where the color of the substrate cover part 37 is black and the case where the color of the substrate cover part 37 is white through a comparison image, as illustrated in the drawing, it can be seen that referring to the image of the first reference point image information 1*a*, in the case where the color of the substrate cover part 37 is formed in black, partial whitening 5*c* is intermittently observed in the first reference point image information 1*a*, but in the case where the color of the substrate cover part 37 is formed in white, partial whitening 5*c* is not observed in the first reference point image information 1*a*. Therefore, when the substrate cover part 37 is formed in white color, the entire luminance of the reflected light sources is uniformly reflected so that the partial whitening 5*c* is not generated in the first reference point image information 1*a* and the second reference point image information 1*b*, so that the center point of the teaching target 20 may be read more clearly.

The teaching driving unit 38 is coupled to the substrate frame part 36, and the substrate frame part 36 is configured in the form of the transfer device 10 for transferring. The teaching driving unit 38 adjusts the position of the substrate frame part 36 during the teaching operation. The teaching driving unit 38 is not limited to the shape illustrated in the drawing and may be variously transformed into a multi-degree-of-freedom robot, a linear actuator, or the like and implemented.

The teaching control unit 39 is electrically connected to the camera substrate module 35, receives the first reference point image information 1*a* obtained by the first camera 33, and receives the second reference point image information 1*b* obtained by the second camera 34. The teaching control unit 39 performs image analysis on the first reference point image information 1*a* obtained through the first camera 33 and the second reference point image information 1*b* obtained through the second camera 34, and converts the analyzed image information into pixels, and coordinates first reference point center coordinates 2*a* included in the first reference point image information 1*a* and second reference point center coordinates 2*b* included in the second reference point image information 1*b*.

In this case, as illustrated in FIG. 9, the teaching control unit 39 overlaps the first reference point image information 1*a* and the second reference point image information 1*b* and integrates the overlapping image information into one integrated coordinate system, calculates movement values ($\Delta$x, $\Delta$y) for how much the first reference point center coordinates 2*a* and the second reference point center coordinates 2*b* have moved from first reference point absolute coordinates 3*a* and second reference point absolute coordinates 3*b* the X-axis and Y-axis in one integrated coordinate system, and calculates an angle value ($\theta$) for how much a line connecting the first reference point center coordinates 2*a* and the second reference point center coordinates 2*b* has rotated with respect to a line connecting the first reference point absolute coordinates 3*a* and the second reference point absolute coordinates 3*b*.

Here, the first reference point absolute coordinates 3*a* and the second reference point absolute coordinates 3*b* are reference absolute coordinate values preset in the teaching control unit 39, and determine the positions of the first camera 33 and the second camera 34, and is a coordinate value preset in the teaching control unit 39 based on a photographing center point of the first camera 33 and a photographing center point of the second camera 34 when the positions of the first camera 33 and the second camera 34 are fixed.

As such, the teaching control unit 39 may calculate the movement values (Δx, Δy) for how much the first reference point center coordinates 2a and the second reference point center coordinates 2b have moved based on the first reference point absolute coordinates 3a and the second reference point absolute coordinates 3b in the X axis and the Y axis, and recognize the angle value (θ) for how much the first reference point center coordinates 2a and the second reference point center coordinates 2b have rotated based on the Z axis.

Accordingly, the teaching control unit 39 may teach the transfer device 10 by determining the movement values (Δx, Δy) for how much the end effector of the transfer device 10 has been moved in the X and Y axes and the angle value (θ) for how much the end effector of the transfer device 10 has rotated in the Z-axis perpendicular to the X-axis and Y-axis through the movement values (Δx, Δy) and angle value (θ).

Hereinafter, a teaching method of a semiconductor manufacturing facility according to an exemplary embodiment of the present invention as described above will be described.

Figure 10:
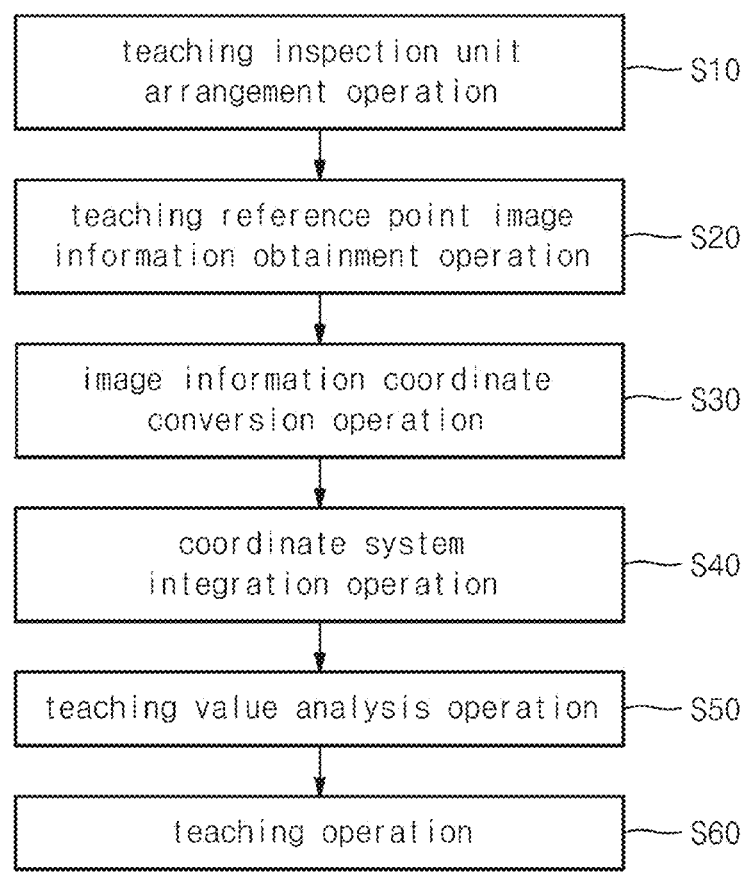
FIG. 10 is a flowchart of a teaching method of a semiconductor manufacturing facility according to an exemplary embodiment of the present invention.

FIG. 10 is a flowchart of a teaching method of a semiconductor manufacturing facility according to an exemplary embodiment of the present invention.

As illustrated in FIG. 10, a teaching method of a semiconductor manufacturing facility according to an exemplary embodiment of the present invention includes a teaching inspection unit arrangement operation S10, a teaching reference point image information obtainment operation S20, an image information coordinate conversion operation S30, a coordinate system integration operation S40, a teaching value analysis operation S50, and a teaching operation S60.

In the teaching inspection unit arrangement operation S10, the first camera 33 and the second camera 34 of the teaching inspection unit 30 are disposed above the transfer device 10 to which the teaching target 20 is mounted. In this case, in the teaching inspection unit arrangement operation S10, as described above, the first lighting unit 31 emits light around the first teaching reference point 21 of the teaching target 20, and the second lighting unit 32 emits light around the second teaching reference point 22 of the teaching target 20, and the substrate cover part 37 made of Carbon Fiber Reinforced Plastics (CFRP) is disposed around the first lighting unit 31 and the second lighting unit 32 to implement a reflective function.

In the teaching reference point image information obtainment operation (S20), the first camera 33 photographs the first teaching reference point 21 of the teaching target 20 to obtain analog image information, and the camera substrate module 35 performs digital signal processing on the obtained analog image information to convert the processed image information into first reference point image information 1a, and the second camera 34 photographs the second teaching reference point 21 of the teaching target 20 to obtain analog image information, and the camera substrate module 35 performs digital signal processing on the obtained analog image information to convert the processed image information into second reference point image information 1b.

In the image information coordinate conversion operation S30, the teaching control unit 39 analyzes pixel values of the first reference point image information 1a to convert the first reference point center coordinates 2a in the first reference point image information 1a into coordinates, and analyzes pixel values of the second reference point image information 1b and converts the second reference point center coordinates 2b in the second reference point image information 1b into coordinates.

In the coordinate system integration operation S40, the first reference point center coordinates 2a and the second reference point center coordinates 2b are output to one coordinate system and integrated.

In the teaching value analysis operation S50, a movement values (Δx, Δy) for how much the first reference point center coordinates 2a and the second reference point center coordinates 2b have moved from the first reference point absolute coordinates 3a and the second reference point absolute coordinates 3b, and an angle value (θ) for how much the first reference point center coordinates 2a and the second reference point center coordinates 2b have rotated are calculated.

In the teaching operation S60, the movement values (Δx, Δy) and the angle value (θ) are transmitted to the transfer device 10, and the teaching operation to correct the reference position of the end effector of the transfer device 10 is performed based on the movement values (Δx, Δy) and the angle value (θ).

In this way, the teaching method of the semiconductor manufacturing facility according to the exemplary embodiment of the present invention performs the teaching operation by correcting the angle of the teaching target 20, as well as the distance of the teaching target 20 with respect to the teaching reference point in the X axis and the Y axis during the teaching operation of the transfer device 10 for transferring the wafer or mask.

As described above, the present invention has been described with reference to the specific matters, such as a specific component, limited exemplary embodiments, and drawings, but these are provided only for helping general understanding of the present invention, and the present invention is not limited to the aforementioned exemplary embodiments, and those skilled in the art will appreciate that various changes and modifications are possible from the description.

Therefore, the spirit of the present invention should not be limited to the described exemplary embodiments, and it will be said that not only the claims to be described later, but also all modifications equivalent to the claims belong to the scope of the present invention.

What is claimed is:

1. A semiconductor manufacturing facility, comprising:
   a teaching target in which a first teaching reference point and a second teaching reference point are formed;
   a transfer device on which the teaching target is mounted; and
   a teaching inspection unit for image-analyzing the first teaching reference point and the second teaching reference point of the teaching target, calculating center coordinates of each of the first teaching reference point and the second teaching reference point, and teaching the transfer device with an angle value of a line connecting the respective center coordinates.

2. The semiconductor manufacturing facility of claim 1, wherein the teaching inspection unit includes:
   a first lighting unit for emitting light around the first teaching reference point;
   a second lighting unit for emitting light around the second teaching reference point;
   a first camera for photographing the first teaching reference point and obtaining analog image information;
   a second camera for photographing the second teaching reference point and obtaining analog image information;
   a camera substrate module for digitally converting image information of each of the first camera and the second camera into first reference point image information and second reference point image information; and a teaching control unit for analyzing each of the first reference point image information and the second reference point image information to calculate first reference point center coordinates of the first teaching reference point and second reference point center coordinates of the second teaching reference point, calculating an angle value between a line connecting first reference point absolute coordinates and second reference point absolute coordinates and a line connecting the first reference point center coordinates and the second reference point center coordinates, and teaching the transfer device as much as the calculated angle value.

3. The semiconductor manufacturing facility of claim 2, wherein the teaching control unit overlaps the first reference point image information and the second reference point image information and integrates the overlapping image information into one integrated coordinate system, calculating a movement value for how much the first reference point center coordinates and the second reference point center coordinates have moved in an X-axis and an Y-axis from the first reference point absolute coordinates and the second reference point absolute coordinates in one integrated coordinate system, and teaching the transfer device as much as the calculated movement value.

4. The semiconductor manufacturing facility of claim 2, wherein the teaching inspection unit includes:

a substrate frame part providing an mounting area in an inner space to mount the first lighting unit, the second lighting unit, the first camera, the second camera, and the camera substrate module; and a substrate cover part which is coupled to the substrate frame part so that the camera substrate module is not exposed, is formed with a first camera hole and a second camera hole through which a lens of the first camera and a lens of the second camera are exposed, respectively, and is formed with a first lighting hole and a second lighting hole through which the lighting unit and the second lighting unit are exposed, respectively.

5. The semiconductor manufacturing facility of claim 4, wherein the substrate cover part is formed of Carbon Fiber Reinforced Plastics (CFRP).

6. The semiconductor manufacturing facility of claim 4, wherein the substrate cover part is formed in the form of a plate in which carbon fibers are woven and a plurality of layers is laminated by bonding, and an exposed surface forms a fabric surface on which a plurality of fibers is woven.

7. The semiconductor manufacturing facility of claim 4, wherein the substrate cover part is formed in a white color.

8. The semiconductor manufacturing facility of claim 2, wherein the first lighting unit and the second lighting unit are formed of a surface lighting.

9. The semiconductor manufacturing facility of claim 8, wherein the first camera and the second camera are disposed between the first lighting unit and the second lighting unit.

10. The semiconductor manufacturing facility of claim 8, wherein the first camera and the second camera are disposed to face each other with respect to a center point of the substrate frame part in an area between the first lighting unit and the second lighting unit.

11. The semiconductor manufacturing facility of claim 1, wherein the teaching target is formed in a shape corresponding to a wafer or a mask.

12. A semiconductor manufacturing facility, comprising:

a teaching target in which a first teaching reference point and a second teaching reference point are formed;

a transfer device on which the teaching target is mounted; and a teaching inspection unit including a first lighting unit for emitting light around the first teaching reference point and formed of a surface light source, a second lighting unit for emitting light around the second teaching reference point and formed of a surface light source, a first camera for photographing the first teaching reference point to obtain analog image information and disposed between the first lighting unit and the second lighting unit, a second camera for photographing the second teaching reference point to obtain analog image information and disposed between the first lighting unit and the second lighting unit, a camera substrate module for digitally converting image information of each of the first camera and the second camera into first reference point image information and second reference point image information, a substrate frame part providing an mounting area in an inner space so that the first lighting unit, the second lighting unit, the first camera, the second camera, and the camera substrate module are mounted, a substrate cover part which is coupled to the substrate frame part so that the camera substrate module is not exposed, is formed with a first camera hole and a second camera hole through which a lens of the first camera and a lens of the second camera are exposed, respectively, is formed with a first lighting hole and a second lighting hole through which the first lighting unit and the second lighting unit are exposed, respectively, and is formed in the form of a plate in which carbon fibers are woven and a plurality of layers is laminated by bonding, has an exposed surface forming a fabric surface on which a plurality of fibers is woven, and is formed in a white color, and a teaching control unit for analyzing each of the first reference point image information and the second reference point image information, calculating first reference point center coordinates of the first teaching reference point and second reference point center coordinates of the second teaching reference point, and calculating an angle value between a line connecting the first reference point absolute coordinates and the second reference point absolute coordinates and a line connecting the first reference point center coordinates and the second reference point center coordinates, and teaching the transfer device as much as the calculated angle value.

* * * * *